United States Patent
Tabata

(10) Patent No.: US 8,713,382 B2
(45) Date of Patent: Apr. 29, 2014

(54) CONTROL APPARATUS AND CONTROL METHOD

(75) Inventor: Makoto Tabata, Saitama (JP)

(73) Assignee: Advantest Corporation, Tokyo (JP)

(*) Notice: Subject to any disclaimer, the term of this patent is extended or adjusted under 35 U.S.C. 154(b) by 335 days.

(21) Appl. No.: 13/213,054

(22) Filed: Aug. 18, 2011

(65) Prior Publication Data

US 2012/0036404 A1 Feb. 9, 2012

Related U.S. Application Data

(63) Continuation of application No. PCT/JP2009/001073, filed on Mar. 10, 2009.

(51) Int. Cl.
*G11C 29/00* (2006.01)
(52) U.S. Cl.
USPC .............................. 714/711; 714/722; 714/723
(58) Field of Classification Search
USPC .......................................... 714/711, 722, 723
See application file for complete search history.

(56) References Cited

U.S. PATENT DOCUMENTS

2001/0052093 A1* 12/2001 Oshima et al. ................. 714/719
2008/0320265 A1* 12/2008 Yung et al. ..................... 711/167

FOREIGN PATENT DOCUMENTS

JP H10-222999 A 8/1998
JP 2001-319493 A 11/2001

OTHER PUBLICATIONS

International Search Report for International Application No. PCT/JP2009/001073, mailed on Aug. 18, 2009.
English translation of Written Opinion (IB338) for International application No. PCT/JP2009/001073, mailed on Oct. 27, 2011.
Office Action issued for counterpart Japanese Application 2009-511292, mailed on Aug. 11, 2009, and machine translation thereof.
Notice of Office Action issued by the Korean Intellectual Property Office for Application No. 10-2011-7018457.
Office action issued against Japanese patent application No. 2010-045700 by the Japan Patent Office on Oct. 9, 2012.

* cited by examiner

*Primary Examiner* — Guy Lamarre

(57) ABSTRACT

A control apparatus controlling testing of a memory under test that includes one or more row repair memory blocks and column repair memory blocks. The control apparatus comprises a counting section that sequentially receives test results respectively indicating pass/fail of a plurality of test blocks of the memory under test, and sequentially counts, for each first-type memory block, which is a row-oriented memory block or a column-oriented memory block, a fail memory block number among second-type memory blocks; a selecting section that selects memory blocks first-type memory blocks for which the fail memory block number exceeds a reference value, such that the number of selected memory blocks is no greater than the number of first-type repair memory blocks of the memory under test; and a test control section that masks test blocks among the memory blocks selected by the selecting section and causes further testing of the memory under test.

14 Claims, 4 Drawing Sheets

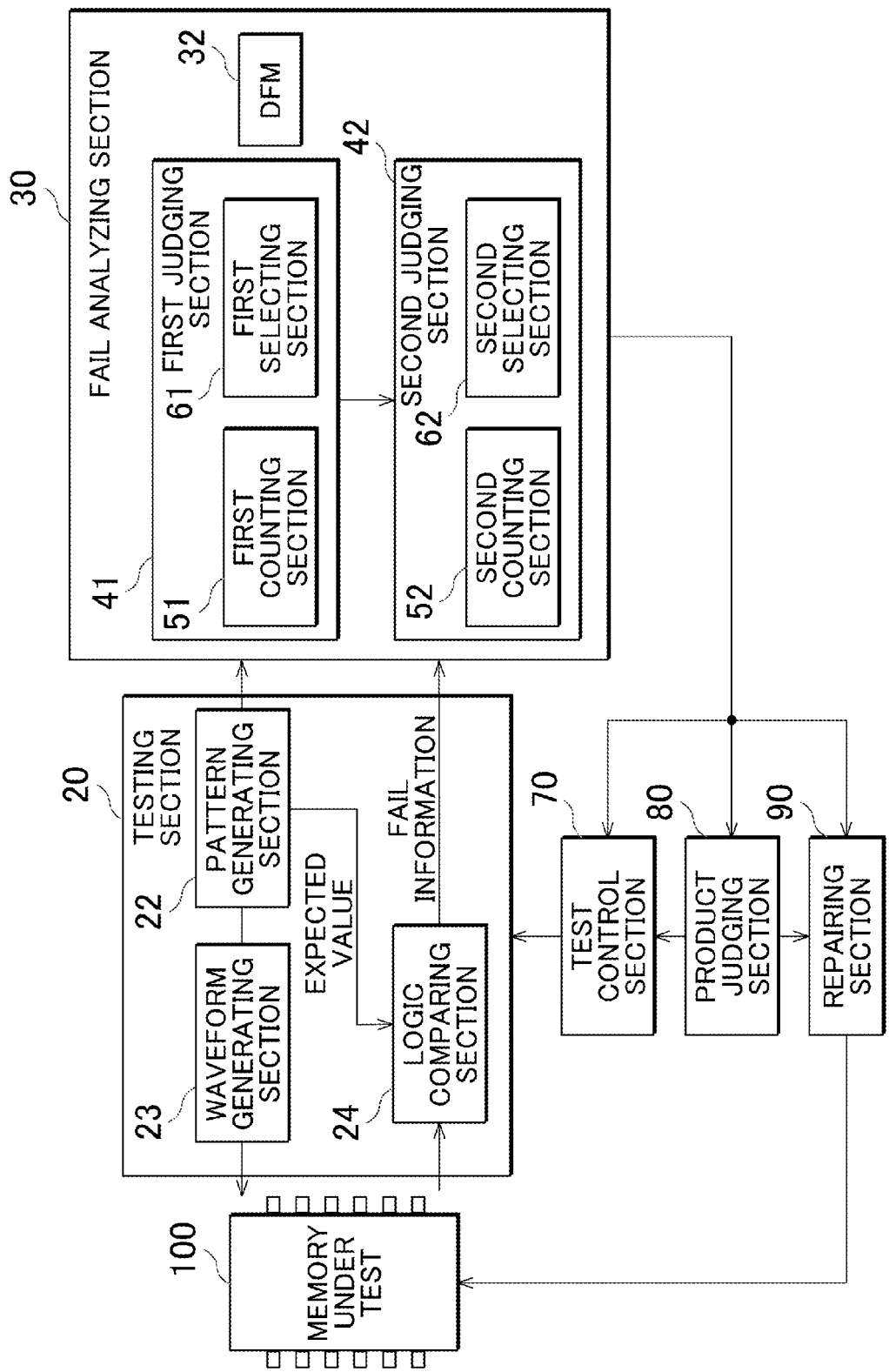
F I G. 1

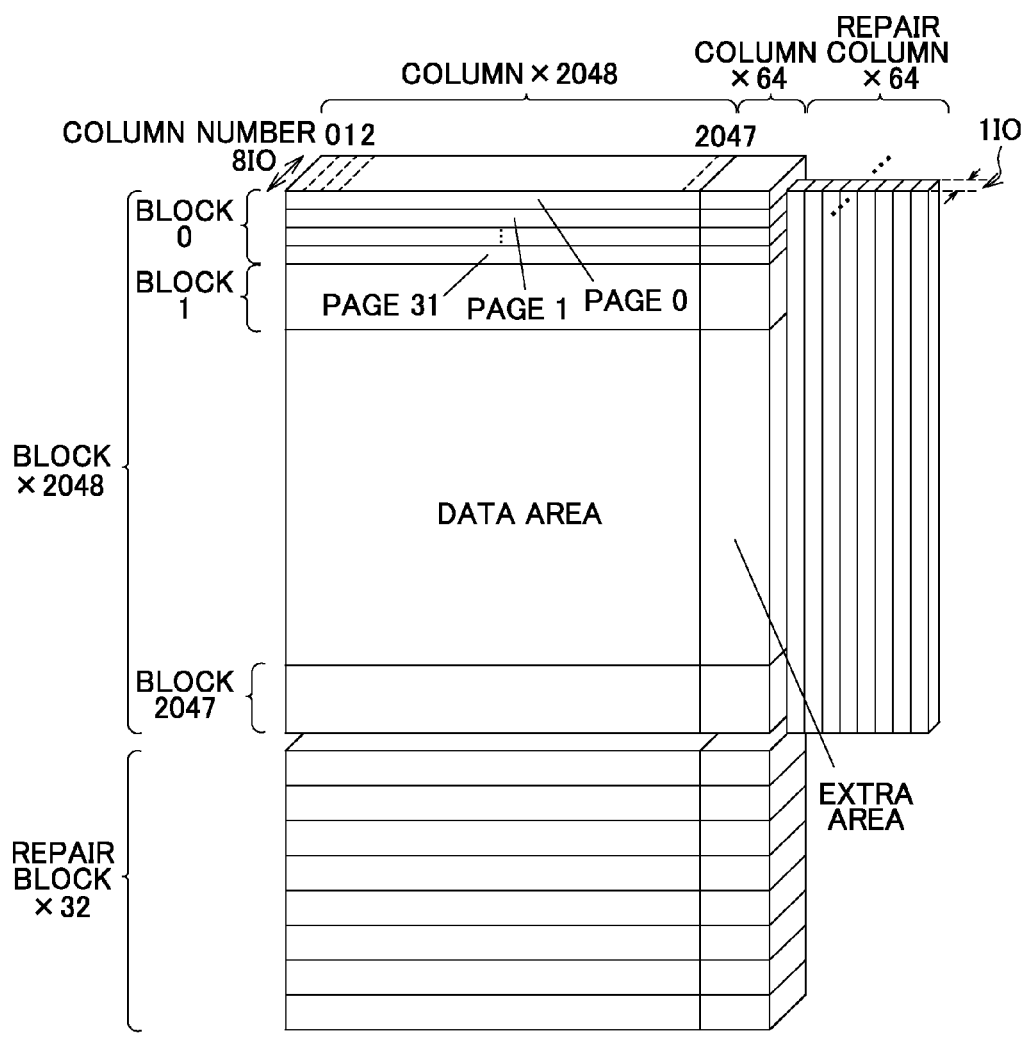
F I G . 2

CONTROL APPARATUS AND CONTROL METHOD

BACKGROUND

1. Technical Field

The present invention relates to a control apparatus and a control method.

2. Related Art

A memory device includes a large number of memory cells, and there may be defective memory cells amongst these memory cells. A device that is manufactured to include redundant memory cells for replacing these defective cells can perform a memory repair process, or redundancy process, to replace the defective memory cells with the redundant memory cells.

Patent Document 1: Japanese Patent Application Publication No. H10-222999

When performing the memory repair process, it is necessary to detect the positions of the defective memory cells and analyze how the detected defective memory cells are to be replaced by the redundant memory cells. In order to perform the memory repair process for a high-capacity memory under test, a fail memory can be provided having the same address space as the memory under test. However, this incurs a high cost and is therefore undesirable. Furthermore, in a system that counts the number of defective bits during testing and judges a row for which this number exceeds a prescribed value to be a row in need of replacement, if a row having an even greater number of defective bits is detected after all of the redundant memory cells have been allocated, this newly detected row cannot be replaced.

SUMMARY

Therefore, it is an object of an aspect of the innovations herein to provide a control apparatus and a control method, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a control apparatus for controlling testing of a memory under test that includes a plurality of memory cells addressed according to rows and columns, one or more row repair memory blocks that are each capable of replacing a row-oriented memory block en bloc, and one or more column repair memory blocks that are each capable of replacing a column-oriented memory block en bloc. The control apparatus comprises a first counting section that sequentially receives test results from a testing section testing the memory under test indicating pass/fail of each of a plurality of test blocks of the memory under test, and sequentially counts, for each first-type memory block, which is one of a row-oriented memory block and column-oriented memory block, a fail memory block number, which is the number of memory blocks judged to be fails among second-type memory blocks, which are each the other of row-oriented memory blocks and column-oriented memory blocks; a selecting section that, when the test blocks have been tested by the testing section, selects memory blocks, from among the first-type memory blocks, for which the fail memory block number exceeds a reference value, such that the number of selected memory blocks is no greater than the number of first-type repair memory blocks of the memory under test; a test control section that masks test blocks included in the memory blocks selected by the selecting section, and causes the testing section to perform further testing of the memory under test; and a judging section that sequentially receives the test results from the testing section testing the memory under test masked by the test control section, and sequentially judges whether each second-type memory block includes a test block that is judged to be a fail.

The selecting section may select memory blocks for which the fail memory block number exceeds the reference value, such that the number of selected memory blocks is no greater than the number of first-type repair blocks that do not include fail memory cells from among the first-type repair memory blocks of the memory under test.

The judging section may include a second counting section that counts the number of second-type memory blocks that include test blocks judged to be fails. The judging section may include a second counting section that counts the number of test blocks judged to be fails for each second-type memory block.

The number of memory cells included in each first-type repair memory block may be less than the number of memory cells included in each second-type memory block.

The selecting section may select memory blocks that do not include test blocks judged to be fails, from among the first-type memory blocks, and the test control section may mask memory blocks selected by the selecting section for which the fail memory block number exceeds the reference value and memory blocks selected by the selecting section that do not include test blocks judged to be fails, and cause the testing section to perform further testing of the memory under test.

The control apparatus may further comprise a product judging section that judges pass/fail of the memory under test based on the test results of the judging section. The product judging section may judge the memory under test to be a pass when the number of second-type memory blocks that include test blocks judged to be fails is less than a predetermined number. The product judging section may judge the memory under test to be a pass when the number of second-type memory blocks that include test blocks judged to be fails is less than the number of second-type repair memory blocks.

The control apparatus may further comprise a repair processing section that replaces the memory blocks selected by the selecting section with the first-type repair memory blocks. The repair processing section may replace the second-type memory blocks that include test blocks judged to be fails with the second-type repair memory blocks.

According to a first aspect related to the innovations herein, provided is a control method for controlling testing of a memory under test that includes a plurality of memory cells addressed according to rows and columns, one or more row repair memory blocks that are each capable of replacing a row-oriented memory block en bloc, and one or more column repair memory blocks that are each capable of replacing a column-oriented memory block en bloc. The control method comprises counting of sequentially receiving test results indicating pass/fail of each of a plurality of test blocks of the memory under test, and sequentially counting, for each first-type memory block, which is one of a row-oriented memory block and column-oriented memory block, a fail memory block number, which is the number of memory blocks judged to be fails among second-type memory blocks, which are each the other of row-oriented memory blocks and column-oriented memory blocks; first selecting of, when the test blocks have been tested, selecting memory blocks, from among the first-type memory blocks, for which the fail memory block number exceeds a reference value, such that the number of selected memory blocks is no greater than the number of first-type repair memory blocks of the memory under test; and judging of masking test blocks included in the memory blocks selected during the first selection, sequentially testing each test block of the memory under test, sequentially receiving the test results indicating pass/fail of each test block, and sequentially judging whether each second-type memory block includes a test block that is judged to be a fail.

The summary clause does not necessarily describe all necessary features of the embodiments of the present invention. The present invention may also be a sub-combination of the features described above.

BRIEF DESCRIPTION OF THE DRAWINGS

FIG. 1 shows a configuration of a test apparatus 10 according to an embodiment of the present invention, along with a memory under test 100.

FIG. 2 shows an exemplary address configuration of the memory under test 100.

DESCRIPTION OF EXEMPLARY EMBODIMENTS

Figure 3:
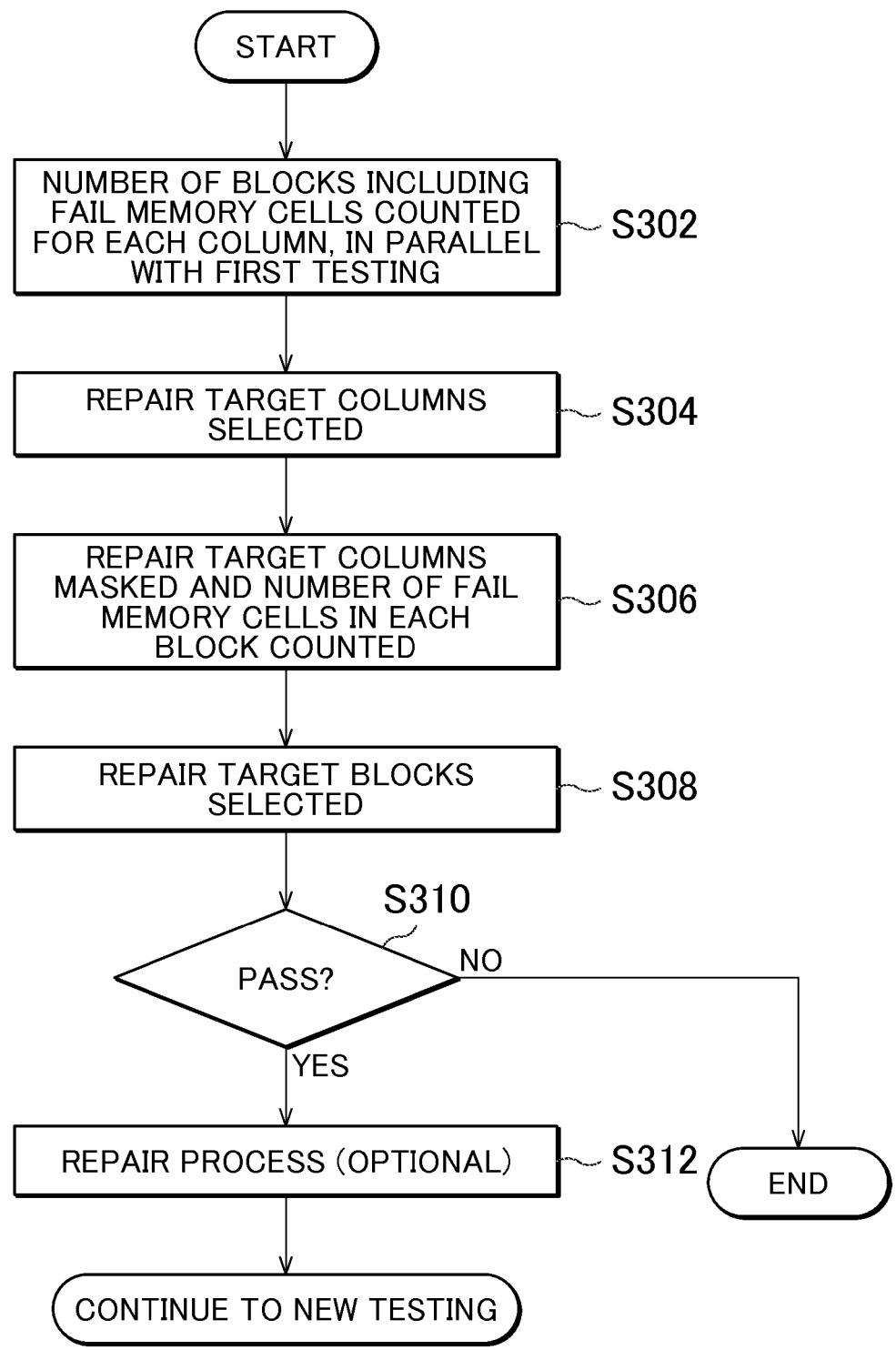
FIG. 3 shows a flow by which the test apparatus 10 tests the memory under test 100 shown in FIG. 2.

Hereinafter, an embodiment of the present invention will be described. The embodiment does not limit the invention according to the claims, and all the combinations of the features described in the embodiments are not necessarily essential to means provided by aspects of the invention.

FIG. 1 shows a configuration of a test apparatus 10 according to an embodiment of the present invention, along with a memory under test 100. The test apparatus 10 tests a memory under test 100 such as a flash memory. The memory under test 100 includes a plurality of memory cells that are addressed by row and column. The memory under test 100 may further includes at least one row repair memory block that can replace a row-oriented memory block en bloc and at least one column repair memory block that can replace a column-oriented memory block en bloc.

The test apparatus 10 includes a control apparatus that has a testing section 20, a fail analyzing section 30, a test control section 70, a product judging section 80, and a repair processing section 90. The testing section 20 tests the memory under test 100 and outputs pass/fail of the memory blocks of the memory under test 100. For example, the testing section 20 may sequentially test each of a plurality of target blocks of the memory under test and sequentially output, to the control apparatus, test results indicating pass/fail of each target block. The target blocks being tested may be memory cells, for example. The testing section 20 includes a pattern generating section 22, a waveform generating section 23, and a logic comparing section 24.

The pattern generating section 22 generates a test pattern of a test signal to be supplied to the memory under test 100, an expected value of an output signal to be output from the memory under test 100 in response to the test signal supplied thereto, and addresses in the memory under test 100 of memory cells to be the target of the testing. The waveform generating section 23 generates a test signal based on the test pattern, and supplies the test signal to the memory under test 100.

The logic comparing section 24 makes a logic comparison between the expected value and the output signal from the memory under test 100, for each bit, and judges pass/fail of the memory cell corresponding to the bit. The logic comparing section 24 outputs to the fail analyzing section 30, as the test result of the testing section 20, fail information indicating, for each bit, pass/fail of the memory cell. The pattern generating section 22 outputs address information to the fail analyzing section 30.

The fail analyzing section 30 includes a first judging section 41, a second judging section 42, and a DFM 32 (data fail memory). The first judging section 41, the second judging section 42, and the DFM 32 can receive fail information output from the logic comparing section 24 and address information output from the pattern generating section 22.

The first judging section 41 includes a first counting section 51 and a first selecting section 61. The second judging section 42 includes a second counting section 52 and a second selecting section 62. Basically, the first selecting section 61 selects a memory block to be replaced by a first type of repair memory block, and the second selecting section 62 selects a memory block to be replaced by a second type of repair memory block.

The first counting section 51 sequentially receives the test results from the testing section 20, and sequentially counts, for each first-type memory block, i.e. a row-oriented memory block or a column-oriented memory block, the number of defective memory blocks that are included among second-type memory block, i.e. the other type of a row-oriented memory block or a column-oriented memory block. When a plurality of memory cells are tested by the testing section 20, the first selecting section 61 selects, as a memory block to be masked in further testing, each first-type memory block for which the number of defective blocks exceeds a reference value. The first selecting section 61 selects memory blocks to be replaced by repair memory blocks.

The first selecting section 61 may select a number of blocks for which the fail memory block number exceeds the reference value, such that the number of selected memory blocks is no greater than the number of first-type repair memory blocks of the memory under test 100. The reference value may be the number of second-type repair memory blocks of the memory under test 100. In other words, the reference value may be the maximum number of blocks that can be repaired by the second-type repair memory blocks of the memory under test 100. In this way, the first selecting section 61 can select, as the memory blocks to be replaced by the first-type repair memory blocks, memory blocks that cannot be completely repaired by the second-type repair memory blocks.

The first selecting section 61 may select a number of memory blocks whose fail memory block number exceeds the reference value, such that the number of selected memory blocks is no greater than the number of first-type repair memory blocks that do not contain a fail memory cell, from among the first-type repair memory blocks of the memory under test 100. In order to determine whether a first-type repair memory block includes a fail memory cell, the first-type repair memory block may be tested while the testing section 20 tests the memory blocks of a storage region of the memory under test 100 or before the testing section 20 tests the memory blocks of the storage region of the memory under test 100.

The test control section 70 masks the memory cells included in the memory blocks selected by the first selecting section 61, and performs further testing of the memory under test 100 using the testing section 20. At this time, the testing section 20 may perform the same testing as described above, except that in this testing a portion of the memory cells of the memory under test 100 are masked. The second judging section 42 sequentially receives the test results from the testing section 20 testing the memory under test 100 masked by the test control section 70, and sequentially determines whether each second-type memory block includes a fail memory cell.

If there is a memory cell judged to be a fail by the second judging section 42, the block containing the fail memory cell is preferably repaired by a second-type repair memory block. In this case, the repair processing section 90 replaces a memory block selected by the first selecting section 61 with a first-type repair memory block. Furthermore, the repair processing section 90 replaces a second-type memory block that includes a fail memory cell with a second-type repair memory block.

The second counting section 52 counts the number of second-type memory blocks that include fail memory cells. In this case, if the value counted by the second counting section 52 is greater than the number of second-type repair memory blocks of the memory under test 100, it is impossible to repair all of the memory cells. In this case, the product judging section 80 may judge the memory under test 100 to be a fail. When the product judging section 80 judges the memory under test 100 to be a fail, the repair processing section 90 need not perform the repair process.

The second counting section 52 may count the number of fail memory cells in each second-type memory block. The second selecting section 62 may then select second-type memory blocks that include a greater number of fail memory cells, and give these selected second-type memory blocks more priority as memory blocks to be replaced by the second-type repair memory blocks. In this way, even if all of the memory cells cannot be repaired, the number of fail memory cells can be reduced. If there is a tolerable amount of fail memory cells, the product yield can be increased.

As described above, the test apparatus 10 can select memory blocks to be repaired by repair memory blocks, by sequentially counting the fail memory cells. As a result, the test apparatus 10 can appropriately determine memory blocks to be repaired without using a fail memory, such as an address fail memory, with an address space corresponding to the memory under test 100. Therefore, the cost of designing and manufacturing the test apparatus 10 can be decreased.

The first selecting section 61 may further select from among the first-type memory blocks, as memory blocks to be masked in further testing, memory blocks that do not include fail memory cells. The test control section 70 may perform further testing of the memory under test 100 using the testing section 20, while masking the memory blocks selected by the first selecting section 61 that do not include fail memory cells and the memory cells selected by the first selecting section 61 whose fail memory block number exceeds the reference value. In this way, the testing time can be shortened by masking, during the second testing, the memory blocks that received a pass judgment for all of the memory cells therein during the first testing.

FIG. 2 shows an exemplary address configuration of the memory under test 100. The memory under test 100 may be a NAND flash memory. The memory under test 100 includes a plurality of blocks that each have a plurality of pages, a plurality of repair columns, and a plurality of repair blocks. The blocks each have a block number, which indicates the position of the block. The pages are units used for reading and writing data. The pages each have a page number indicating the position of the page within the block.

Each page has a plurality of columns. The number of columns in each page is the same. Each column in a page has a column number identifying the column. The same column numbers may be used in each page of each block. Accordingly, by specifying a column number, columns in the same position in every page and every block can be specified. Furthermore, each page includes a data area in which user data is stored and an extra area in which management data, for example, is stored. One column in one page includes a prescribed number of bits of memory cells, and inputs and outputs a data in parallel using a plurality of IO pins.

Here, a repair column is an example of a row repair memory block. In other words, each repair column replaces a column containing fail memory cells, and has a 1-bit width in order to be used as a storage region. The repair columns include IOs corresponding to a column at the same position for every page of every block of the memory under test 100, and each repair column can replace one column in the same position in every page and every block, as a result of the repair process.

A repair block is an example of a column repair memory block. Each repair block is formed of a 32-page memory block. In other words, each repair block is a memory block to be used as a storage region in place of a block containing fail memory cells. Each repair block has substantially the same configuration, and can be exchanged with a single block by performing the repair process. A memory under test 100 that is repaired in this way can function as an acceptable memory device.

The number of memory cells in each repair column is less than the number of memory cells in each repair block. In a case such as this, the columns to be repaired using the repair columns are selected prior to selecting the blocks to be repaired by the repair blocks, as described above. Since the column positions, which are repaired using the repair columns that are set to have more flexibility than the repair block, are selected first, there is less of a chance that the repair will not be possible later using the repair blocks.

FIG. 3 shows a flow by which the test apparatus 10 tests the memory under test 100 shown in FIG. 2. At step 302, the fail analyzing section 30 performs a fail analysis in parallel with the first testing by the testing section 20.

In the first testing, the testing section 20 reads the data written to the memory under test 100, and compares the read data to an expected value to judge pass/fail of each memory cell. The pass/fail judgment results are sequentially output from the logic comparing section 24 to the fail analyzing section 30, as the pass/fail judgment output.

The first counting section 51 sequentially receives the pass/fail judgment output for each memory cell from the logic comparing section 24. The first counting section 51 sequentially counts the number of fail blocks for each column, based on the column address received from the pattern generating section 22 when a pass/fail judgment output received form the logic comparing section 24 indicates a fail.

At step 304, the first selecting section 61 selects at least one column to be repaired, based on the number of fail blocks in each column. The first selecting section 61 selects a number of columns that does not exceed the number of repair columns of the memory under test 100. The columns selected by the first selecting section 61 for repair are referred to hereinafter as repair target columns.

At step 306, the fail analyzing section 30 performs the fail analysis in parallel with the second testing by the testing section 20. During the second testing, in the same manner as in the first testing, the testing section 20 reads the data written to the memory under test 100 and compares the read data to an expected value to judge pass/fail of each memory cell. However, in the second testing, the memory cells associated with repair target columns selected at step 304 are masked, under the control of the test control section 70.

The pass/fail judgment output that is sequentially output from the logic comparing section 24 during the second testing is supplied to the second counting section 52. The second counting section 52 counts the number of fail memory cells for each block, based on the row address received from the pattern generating section 22 when a pass/fail judgment output received form the logic comparing section 24 indicates a fail.

At this time, the second counting section 52 need not count the fail memory cells indicated by the pass/fail judgment output of the memory cells at column addresses corresponding to repair target columns selected at step 304. Furthermore, the pattern generating section 22 need not generate test signals for these columns. The expected value and output from the memory cells at these column addresses, which are input to the logic comparing section 24, may be set to be prescribed bit values. The pass/fail judgment output of the memory cells at these column addresses output from the logic comparing section 24 may be set to bit values indicating a pass.

At step 308, the second selecting section 62 determines whether there are blocks to be repaired, based on the number of fail memory cells in each block. If there are blocks to be repaired, the second selecting section 62 selects one or more blocks to be repaired based on the number of fail memory cells. In the following description, the blocks selected by the second selecting section 62 to be repaired are referred to as "repair target blocks."

At step 310, the product judging section 80 judges pass/fail of the memory under test 100. For example, the product judging section 80 may judge whether the ratio of the number of blocks including fail memory cells to the total number of blocks is less than a predetermined value. When the product judging section 80 judges that this ratio is greater than or equal to the predetermined value (the "NO" of step 310), an output is made indicating that the memory under test 100 is a fail.

When the product judging section 80 judges that this ratio is less than the predetermined value (the "YES" of step 310), the process moves to step 312. In this way, the product judging section 80 can judge pass/fail of the memory under test 100 based on the judgment results of the second judging section 42. When the number of blocks including fail memory cells is less than a predetermined number, the product judging section 80 may judge the memory under test 100 to be a pass. When the number of blocks including fail memory cells is less than the number of repair blocks, the product judging section 80 may judge the memory under test 100 to be a pass.

At step 312, the repair processing section 90 performs the repair process to replace the repair target columns with the repair columns and to then replace the repair target blocks with the repair blocks.

The repair processing section 90 may perform the column repair process by writing information concerning column repair to a prescribed storage region of the memory under test 100, for example. The repair processing section 90 may perform the block repair process by writing information concerning block repair to a prescribed storage region of the memory under test 100. When a column number of the memory under test 100 on which the column repair process has been performed that was a target of the column repair process is accessed by a user device, reading, writing, and deletion is performed for the repair column instead of the original column. The blocks are handled in the same way.

A new test is then performed on the repaired memory under test 100. A user can select whether a repair process is actually performed at step 312, and other testing can be performed without actually performing the repair process.

The test apparatus 10 may perform the process from step 302 to step S312 described above when performing testing by new reading of the same or different content from the above. In this way, when performing the next read test, the test apparatus 10 can perform further repair by performing at least one of the column repair process and the block repair process for the newly detected fail memory cells.

Furthermore, since the repair target columns are determined prior to determining the repair target blocks, the repair blocks can be prevented from being used prematurely. Therefore, a greater number of repair blocks can be kept unused. Then, when blocks to be repaired are detected in subsequent testing, there is a greater chance that these blocks can be repaired by the remaining repair blocks.

As a result of the steps described above, the test apparatus 10 can select repair target columns and repair target blocks without using a high-capacity fail memory.

Figure 4:
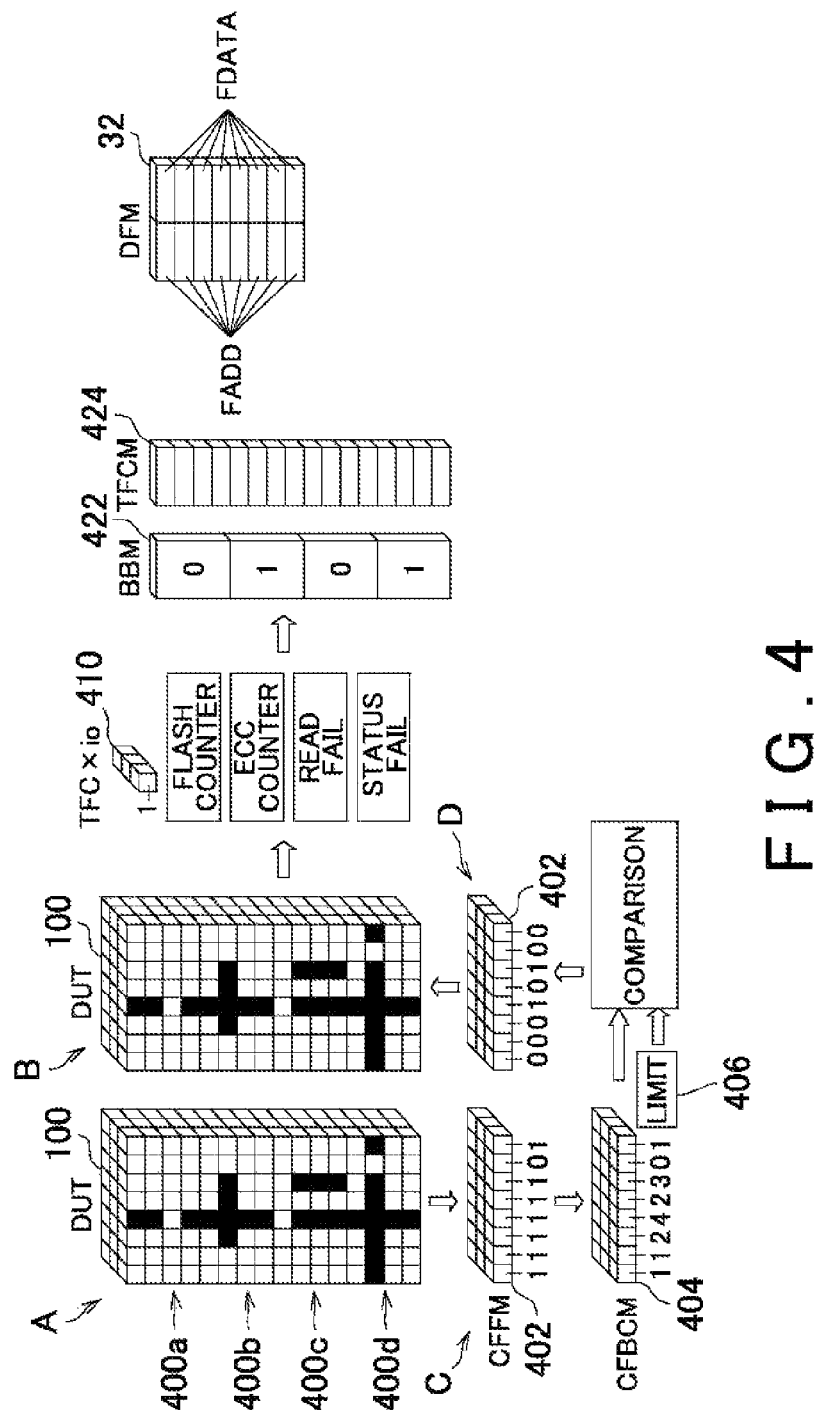
FIG. 4 schematically shows an exemplary test flow.

FIG. 4 schematically shows an exemplary test flow. In order to explain the testing process performed by the test apparatus 10 as simply as possible, FIG. 4 shows a simplified version of the address configuration of the memory under test 100 as shown by the reference letter A. In FIG. 4, the memory under test 100 is simplified to have eight columns and an IO width of three. Furthermore, the memory under test 100 is divided into four blocks 400a to 400d.

During the first testing that corresponds to step 302 of FIG. 3, the testing section 20 sequentially selects pages and performs testing. The first judging section 41 receives address information from the pattern generating section 22 and pass/fail judgment output from the logic comparing section 24, and stores fail flag values, which each indicate whether a fail memory cell is present in a column, in a CFFM (column flag fail memory) 402 in association with a column address. The CFFM 402 may be a component included in the first judging section 41, for example.

The CFFM 402 stores a fail flag value of 1 at each address corresponding to a column that includes a fail memory cell. The CFFM 402 stores a fail flag value of 0 at each address corresponding to a column that does not include a fail memory cell. More specifically, the CFFM 402 is initialized when the first page of each block is tested by the testing section 20, and when a fail memory cell is detected in a block, stores a value of 1 at the address corresponding to the column of this fail memory cell.

When testing of all of the pages in a block has yet to be completed, the value stored in the CFFM 402 indicate whether a fail memory cell has been detected in a column of this block up to the present. When testing of all of the pages of a block is completed, the value stored in the CFFM 402 indicates whether a fail memory cell has been detected in any of the memory cells in a column of the block (see reference letter C).

The first counting section 51 receives the pass/fail judgment output from the logic comparing section 24, and stores the number of fail memory cells among the memory cells at each column address for each column, in a CFBCM (column flag block count memory) 404. The CFBCM 404 may be a component included in the first counting section 51, for example.

When the pass/fail judgment output received from the logic comparing section 24 indicates a fail, the CFBCM 404 stores a value resulting from the incrementation of the stored count value, on a condition that this is the first fail memory cell detected in the block including this memory cell. More specifically, when the pass/fail judgment output indicates a fail, the incremented count value is stored in the CFBCM 404 on a condition that a value of 0 is stored at the corresponding address in the CFFM 402. When the testing is completed for all of the pages in a storage region of the memory under test 100, the value recorded in the CFBCM 404 indicates the number of fail blocks.

When testing is completed for all of the pages, the repair target columns are selected by the first selecting section 61, as described in step 304 of FIG. 3. The first selecting section 61 determines the repair target columns to be the columns for which the CFBCM 404 stores a number of fail blocks greater than or equal to the reference value 406. The reference value 406 may be the number of repair blocks of the memory under test 100, for example. The first selecting section 61 selects a number of repair target columns that does not exceed the number of repair columns of the memory under test 100.

The first selecting section 61 may also select, as repair target columns, columns for which the counted number of fail blocks is less than the reference value 406. For example, from among the columns for which the counted number of fail blocks is less than the reference value 406, the first selecting section 61 may prioritize the selection of columns having higher counted number of fail blocks as repair target columns. The first selecting section 61 may sequentially select columns having higher counted numbers of fail blocks, beginning with the highest number, as repair target columns, until reaching the number of repair columns of the memory under test 100.

The first selecting section 61 sets a value of 1 for the flag value recorded at the address of the CFFM 402 corresponding to the column address of each selected repair target column, and sets a value of 0 for the flag value recorded at each other address of the CFFM 402 (see reference letter D). In this way, when the first testing and the selection process of the repair target columns, corresponding to step 304, are completed, each address for which the CFFM 402 stores a flag value of 1 indicates the address of a repair target column.

All of the memory cells in the repair target columns are masked during the second testing. The memory under test 100 shown by reference letter B schematically represents the masked state. The fourth column from the left and the third column from the right are masked during the second testing.

During the second testing, which corresponds to step 306 of FIG. 3, the testing section 20 sequentially selects and tests the pages, in the same manner as the first testing. While the selected pages are being tested, the fail analyzing section 30 analyzes the fail information in the manner described below.

The second counting section 52 receives the pass/fail judgment output from the logic comparing section 24, and stores the number of fail memory cells among the memory cells of each row address in a TFC (total fail counter) 410, in association with the row address. The TFC 410 may be a component included in the second counting section 52, for example. When testing is completed for all of the specified pages, the values stored in the TFC 410 indicate the numbers of fail memory cells present in the memory blocks corresponding to the row addresses. As described above, the fourth column from the left and the third column from the right are masked during the second testing, and therefore these columns are not counted in the TFC 410.

When testing of a specified page is finished, the second counting section 52 stores a count value, obtained as the sum across the JO width of the count values stored by the TFC 410, in a TFCM (total fail count memory) 424 at an address corresponding to this page. The TFCM 424 may be a component included in the second counting section 52, for example.

During the second testing, the fail analysis and testing corresponding to a specified page is repeated while sequentially changing the pages.

When testing of one block of pages is finished, the TFCM 424 stores a value obtained by detecting fail memory cells for each page, at an address corresponding to the row address of the pages of the block in the memory under test 100. When one or more fail memory cells are detected in a block, a BBM (bad block memory) 422 stores a bit value indicating whether this block is a fail block.

The second judging section 42 may determine whether a block is a fail block. The second judging section 42 may determine whether a block is a fail based on a flash counter, an ECC counter, read fail information, and status fail information. If the ECC error is corrected, the block may be determined to be a pass block.

When testing is completed for all of the pages, the second selecting section 62 selects the repair target blocks, which corresponds to step 308 of FIG. 3. The second selecting section 62 selects the repair target blocks based on the information stored in the BBM 422 and the count value stored in the TFCM 424. More specifically, the second selecting section 62 specifies blocks in which one or more fail memory cells were detected, based on the count value stored in the TFCM 424.

For example, the second selecting section 62 may calculate a total value obtained by summing, in block units, the count value stored in the TFCM 424 for each page, and this total value may be referred to as the overall fail memory cell count. The second selecting section 62 selects the repair target blocks from among fail blocks, which are either blocks of the memory under test 100 for which a bit value of 1 is recorded in the corresponding address of the BBM 422 or blocks of the memory under test 100 for which an overall fail memory cell count of one or more is calculated. At this time, the second selecting section 62 selects repair target blocks such that the number of selected repair target blocks does not exceed the number of repair blocks of the memory under test 100.

The second selecting section 62 may prioritize the selection of blocks having a greater overall fail memory cell count as the repair target blocks. When the number of fail blocks is less than or equal to the number of repair blocks of the memory under test 100, the second selecting section 62 may select all of the fail blocks as repair target blocks.

During the second testing, fail information is stored in the DFM 32, based on the address information from the pattern generating section 22 and the pass/fail judgment results of the logic comparing section 24. The DFM 32 stores fail data in association with addresses corresponding to fail memory cells. The fail analyzing section 30 can create fail bitmap data based on the information stored in the DFM 32.

While an embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A control apparatus for controlling testing of a memory under test that includes a plurality of memory cells addressed according to rows and columns, one or more row repair memory blocks that are each capable of replacing a row-oriented memory block en bloc, and one or more column repair memory blocks that are each capable of replacing a column-oriented memory block en bloc, the control apparatus comprising:
   a first counting section that sequentially receives test results from a testing section testing the memory under test indicating pass/fail of each of a plurality of test blocks of the memory under test, and sequentially counts, for each first-type memory block, a fail memory block number, which is the number of memory blocks judged to be fails among second-type memory blocks, wherein either i) a first-type memory block denotes a row-oriented memory block and a second-type memory block denotes a column-oriented memory block or ii) a first-type memory block denotes a column-oriented memory block and a second-type memory block denotes a row-oriented memory block;
   a selecting section that, when the test blocks have been tested by the testing section, selects memory blocks, from among the first-type memory blocks, for which the fail memory block number exceeds a reference value, such that the number of selected memory blocks is no greater than the number of first-type repair memory blocks of the memory under test, wherein a first-type repair memory block denotes a row repair memory block if the first-type memory block denotes a row-oriented memory block, and a first-type repair memory block denotes a column repair memory block if the first-type memory block denotes a column-oriented memory block;
   a test control section that masks test blocks included in the memory blocks selected by the selecting section, and causes the testing section to perform further testing of the memory under test; and
   a judging section that sequentially receives the test results from the testing section testing the memory under test masked by the test control section, and sequentially judges whether each second-type memory block includes a test block that is judged to be a fail.

2. The control apparatus according to claim 1, wherein
   when the test blocks have been tested by the testing section, the selecting section selects, as memory blocks to be repaired by the first-type repair memory blocks, first-type memory blocks for which the fail memory block number exceeds the reference value, such that the number of selected memory blocks is no greater than the number of first-type memory repair blocks of the memory under test,
   the test control section masks the test blocks among the memory blocks selected by the selecting section, and causes the testing section to sequentially test each of the test blocks of the memory under test and to outputs test results that each indicate pass/fail of a test block, and
   the judging section sequentially receives the test results from the testing section testing the memory under test masked by the test control section, sequentially determines whether each second-type memory block includes a test block judged to be a fail, and selects, as memory blocks to be repaired by second-type repair memory blocks, second-type memory blocks that include test blocks judged to be fails, wherein a second-type repair memory block denotes a row repair memory block if the second-type memory block denotes a row-oriented memory block, and a second-type repair memory block denotes a column repair memory block if the second-type memory block denotes a column-oriented memory block.

3. The control apparatus according to claim 1, wherein
   the selecting section selects memory blocks for which the fail memory block number exceeds the reference value, such that the number of selected memory blocks is no greater than the number of first-type repair blocks that do not include fail memory cells from among the first-type repair memory blocks of the memory under test.

4. The control apparatus according to claim 1, wherein
   the judging section includes a second counting section that counts the number of second-type memory blocks that include test blocks judged to be fails.

5. The control apparatus according to claim 1, wherein
   the judging section includes a second counting section that counts the number of test blocks judged to be fails for each second-type memory block.

6. The control apparatus according to claim 1, wherein
   the number of memory cells included in each first-type repair memory block is less than the number of memory cells included in each second-type memory block.

7. The control apparatus according to claim 1, wherein
   the selecting section selects memory blocks that do not include test blocks judged to be fails, from among the first-type memory blocks, and
   the test control section masks memory blocks selected by the selecting section for which the fail memory block number exceeds the reference value and memory blocks selected by the selecting section that do not include test blocks judged to be fails, and causes the testing section to perform further testing of the memory under test.

8. The control apparatus according to claim 1, further comprising a product judging section that judges pass/fail of the memory under test based on the test results of the judging section.

9. The control apparatus according to claim 8, wherein
   the product judging section judges the memory under test to be a pass when the number of second-type memory blocks that include test blocks judged to be fails is less than a predetermined number.

10. The control apparatus according to claim 9, wherein
    the product judging section judges the memory under test to be a pass when the number of second-type memory blocks that include test blocks judged to be fails is less than the number of second-type repair memory blocks, wherein a second-type repair memory block denotes a row repair memory block if the second-type memory block denotes a row-oriented memory block, and a second-type repair memory block denotes a column repair memory block if the second-type memory block denotes a column-oriented memory block.

11. The control apparatus according to claim 1, further comprising a repair processing section that replaces the memory blocks selected by the selecting section with the first-type repair memory blocks.

12. The control apparatus according to claim 11, wherein
    the repair processing section replaces the second-type memory blocks that include test blocks judged to be fails with second-type repair memory blocks, wherein a second-type repair memory block denotes a row repair memory block if the second-type memory block denotes a row-oriented memory block, and a second-type repair memory block denotes a column repair memory block if the second-type memory block denotes a column-oriented memory block.

13. A control method for controlling testing of a memory under test that includes a plurality of memory cells addressed according to rows and columns, one or more row repair memory blocks that are each capable of replacing a row-oriented memory block en bloc, and one or more column repair memory blocks that are each capable of replacing a column-oriented memory block en bloc, the control method comprising:

sequentially receiving test results indicating pass/fail of each of a plurality of test blocks of the memory under test, and sequentially counting, for each first-type memory block, a fail memory block number, which is the number of memory blocks judged to be fails among second-type memory blocks, wherein either i) a first-type memory block denotes a row-oriented memory block and a second-type memory block denotes a column-oriented memory block or ii) a first-type memory block denotes a column-oriented memory block and a second-type memory block denotes a row-oriented memory block;

when the test blocks have been tested, selecting memory blocks, from among the first-type memory blocks, for which the fail memory block number exceeds a reference value, such that the number of selected memory blocks is no greater than the number of first-type repair memory blocks of the memory under test, wherein a first-type repair memory block denotes a row repair memory block if the first-type memory block denotes a row-oriented memory block, and a first-type repair memory block denotes a column repair memory block if the first-type memory block denotes a column-oriented memory block; and masking test blocks included in the selected memory blocks, sequentially testing each test block of the memory under test, sequentially receiving the test results indicating pass/fail of each test block, and sequentially judging whether each second-type memory block includes a test block that is judged to be a fail.

14. The control method of claim 13, wherein the selecting includes, when the test blocks have been tested, selecting, as memory blocks to be repaired by the first-type repair memory blocks, first-type memory blocks for which the fail memory block number exceeds the reference value, such that the number of selected memory blocks is no greater than the number of first-type memory repair blocks of the memory under test, and the control method further comprises selecting, as memory blocks to be repaired by second-type repair memory blocks, the second type memory blocks that include test blocks judged to be fails during the judging, wherein a second-type repair memory block denotes a row repair memory block if the second-type memory block denotes a row-oriented memory block, and a second-type repair memory block denotes a column repair memory block if the second-type memory block denotes a column-oriented memory block.

* * * * *